United States Patent [19]
Killion

[11] Patent Number: 4,592,087
[45] Date of Patent: May 27, 1986

[54] CLASS D HEARING AID AMPLIFIER

[75] Inventor: Mead C. Killion, Elk Grove Village, Ill.

[73] Assignee: Industrial Research Products, Inc., Elk Grove Village, Ill.

[21] Appl. No.: 559,386

[22] Filed: Dec. 8, 1983

[51] Int. Cl.⁴ .............................................. H04R 3/00
[52] U.S. Cl. .................. 381/68; 179/107 R; 179/107 E; 381/117; 330/251
[58] Field of Search ...................... 179/107 R, 107 E; 381/68, 88, 117; 330/251, 10

[56] References Cited
U.S. PATENT DOCUMENTS 3,995,114  11/1976  Marschinke .......................... 179/107
4,068,090   1/1978  Komatsu ............................ 179/107 R
4,471,490   9/1984  Bellafiore .......................... 179/107 E Primary Examiner—Gene Z. Rubinson
Assistant Examiner—L. C. Schroeder
Attorney, Agent, or Firm—Stephen R. Arnold; Leo J. Aubel

[57] ABSTRACT

A subminiature power amplifier for hearing aids configured to be completely self-contained and fit within the user's ear features a Class D amplifier stage. By configuring all signal elements as digital units, circuit balance is readily maintained. A substantial economy of battery drain is achieved while preserving a low value of distortion at low signal levels. Oscillator frequency is governed by a single resistance element. The amplifier and an optional efficiency-improving inductor can be accommodated entirely within the residual volume of the motor chamber of a state-of-the-art earphone housing.

17 Claims, 16 Drawing Figures

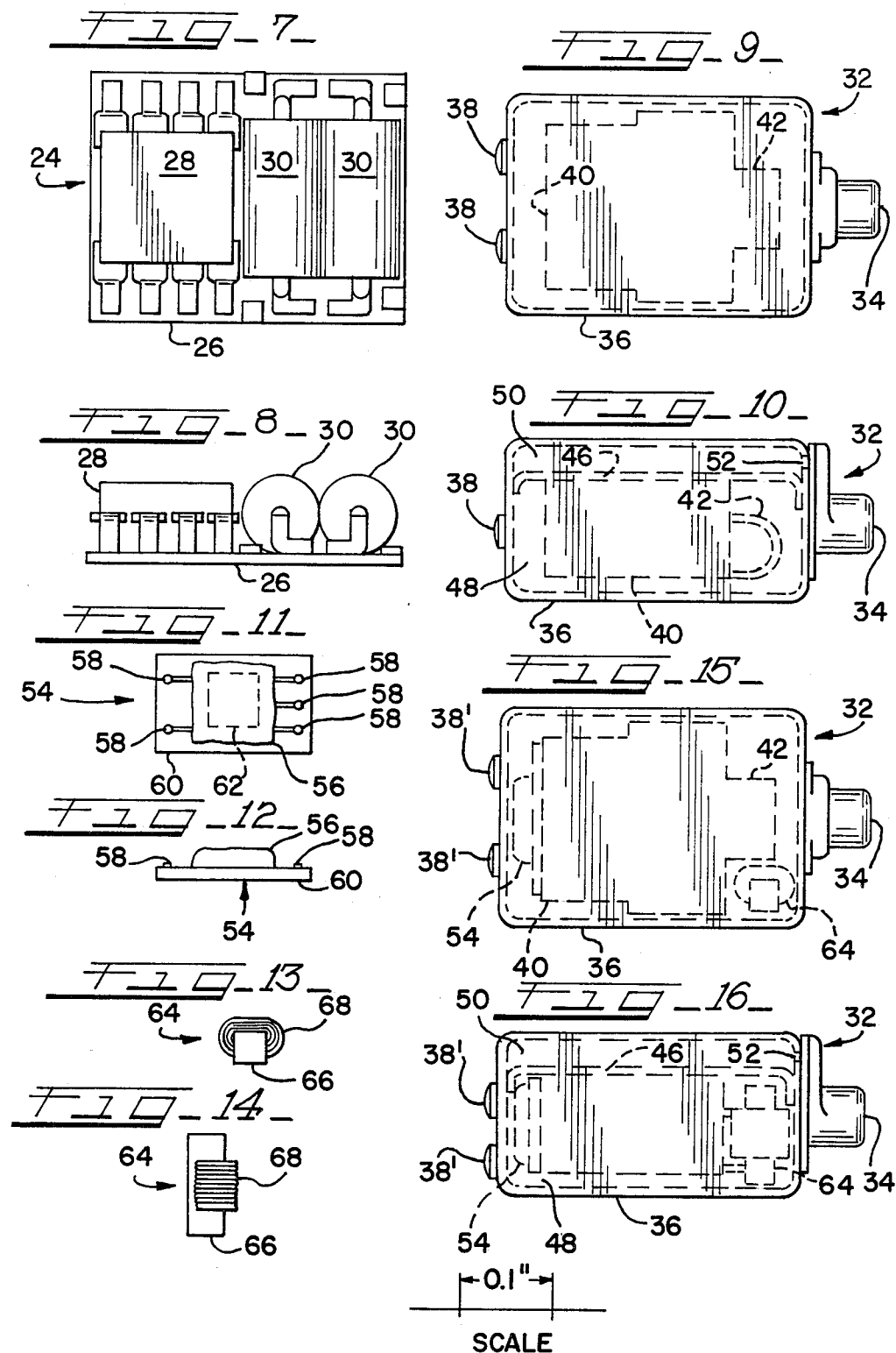

4,592,087

CLASS D HEARING AID AMPLIFIER

TECHNICAL FIELD OF THE INVENTION

The technical field of the invention is audio amplifiers for hearing aids, in particular ultra-miniature hearing aids that can be worn entirely within the ear.

BACKGROUND OF THE INVENTION

In recent years, hearing aids and their associated battery power supply and amplifier have been successfully miniaturized to a size where they can be worn entirely within the ear. A persistent problem with state of the art units of this type is the distortion-power consumption trade-off. More specifically, low distortion units run as conventional class A device circuits can be designed to provide suitably low output signal distortion, particularly at low levels; however, since class A devices (and in particular class A output stages) exhibit a very low power efficiency, the concomitant battery drain by such units is quite high, requiring frequent replacement of the hearing aid battery. In an effort to improve the overall power efficiency of the system, resort has been made to units employing class B amplifier circuitry in the output stage. Since class B amplifiers, by definition, idle at a cut-off condition, the usual result in simple class B circuits is that, at low signal levels, distortions are encountered which render the signal quality undesirably harsh.

To avoid this problem rather elaborate balancing circuitry is required to equalize the behavior of the two halves of the amplifier circuit at both high and low drive levels, and to provide uniform crossover characteristics. In practice this mandates the use of strong inverse feedback which, as is well known to those knowledgeable in the art, requires high gain circuitry with strong inverse feedback applied therearound. Because of this, there is a strong possibility of oscillation, which in turn frequently requires the use of physically large feedback or decoupling capacitors of several microfarads.

A superficially attractive, but to date never satisfactorily accomplished, alternative is to use a class D amplification system of pulse width modulation, wherein a ultrasonic rectangular waveform generator has its duty cycle continuously adjusted responsively to the instantaneous amplitude of the audio waveform received from the hearing aid receiver. The resulting output contains the original audio frequency intelligence, as well as switching modulation components in the supersonic range. Although such systems are characterized by low distortion and are power-efficient, nevertheless a significant amount of battery power is represented in losses contained in the ultrasonic switching modulation components. Moreover, such systems are usually more complex than straightforward class A or class B systems, owing to the necessity for providing an oscillator, a switching modulator and a variety of adjustable components necessary to secure adequate balance of the circuit. A further source of difficulty is posed by the requirement that it be powered by a system battery of 1.5 volts.

To the applicant's knowledge, no adequately small low-power, low-distortion class D amplification system has been devised which meets all system requirements, and which can additionally be manufactured in a sufficiently small size to allow fabrication of a hearing aid designed to fit within the ear. Thus, such an amplifier would be a useful and novel addition to the art, particularly if characterized by tolerable battery drain, small size and low distortion characteristics.

SUMMARY OF INVENTION

According to a feature of the invention, an integrated circuit class D hearing aid power amplifier is fabricated in the preferred form from complementary metal oxide semiconductor (CMOS) devices driven in switching mode. In the preferred form of the invention, the necessary switching oscillator is fashioned from three cascaded CMOS switching stages configured as a ring oscillator, with the individual charging times for each stage contributing to the total delay which establishes the frequency. All three stages are collectively controlled to substantially identical charge and release times by means of adjustable load elements in a cascode-type circuit, all six cascode load elements being driven from a coupled pair of current-mirrors to maintain symmetric operation at low current drain. By configuring the oscillator to work at twice the desired switching frequency, and by dividing the oscillator output by means of an integral scale-of-two divider, complete symmetry of the oscillator output waveform is maintained without substantial duty cycle drift. By use of such current mirrors to control all six cascode load elements, all charging currents, and hence the frequency of oscillation can be controlled by means of a single resistor. An alternative oscillator circuit uses CMOS driver transistors with similar current-mirror control, but wherein current limiting is secured by controlling source degeneration.

According to a feature of the invention, the ultrasonic square wave produced by the oscillator is fed through a biased integrator to produce at the output thereof a triangular waveform, the axis crossings of which are controlled by the bias applied to the integrator, the bias being produced responsively to an input waveform derived from the microphone. The effect of impressing the audio frequency signal from the microphone upon the integrator is to shift the axis crossing of the triangular waveform from a quiescent symmetric condition to an unbalanced condition, the amount of unbalance both in sign and magnitude being a continuously varying function of the amplitude of the audio waveform.

According to a feature of the invention, the axis crossings of the integrator output waveform are used to control the time and the polarity of the output of a polarity reversing balanced CMOS switching driver connected to drive an earphone transducer. The duration of the positive and negative switch pulses produced by the driver vary according to the time delay between axis crossings at the integrator output, thereby providing a pulse modulated signal to the earphone load having a frequency spectrum in the audio band representing a facsimile of the waveform produced by the microphone.

According to another feature of the invention, the switching driver output is balanced by controlling the value of the single resistor in a supplemental d.c. biasing network to provide zero d.c. output current under zero audio signal conditions, and hence the earphone load may be coupled directly to the output nodes of the switching driver without requiring a blocking capacitor interposed therebetween This is most advantageously accomplished by forming the supplemental network as fired-on resistors on the integrated circuit chip carrier during the manufacturing process. Adjustment is by trimming of the single resistor.

According to still another feature of the invention, a optional reactive filter is interposed between the output of the switching driver and the earphone, the filter having the property that as seen from the driver the resulting driver loads looks substantially purely inductive at the supersonic switching-frequencies, thereby returning substantially all of the power spectrum represented by the supersonic frequency components back to the power supply battery, rather than allowing them to dissipate in the receiver and thus contribute to overall system power drain.

In both embodiments of the inventive system the new amplifier and filter occupy a total volume of only 0.0007 cubic inches. Low-level total current drain is approximately 50 microamperes, with the audio quality at low listening levels characterized by a total harmonic distortion content of approximately 0.5%. Distortion at 500 Herz and 110 dB sound pressure level is approximately 5%.

In a prefered embodiment of the invention, the amplifier and the optional filter inductor are both disposed within the motor compartment of the receiver housing itself, so that the amplifier and filter require no extra dedicated volume whatever, being totally contained within a state-of-the-art transducer housing.

DESCRIPTION OF DRAWINGS

The foregoing features and advantages of the present invention will be apparent from the following more particular description of the invention. The accompanying drawings, listed hereinbelow, are useful in explaining the invention wherein:

FIG. 5 is a partial schematic of a modified current biasing circuit for use in a voltage controlled oscillator;

FIG. 6 is a pictorial view of a representative hearing aid configured to be worn in the ear, the hearing aid having associated therewith as internal modular elements as shown in schematic dotted outline, a microphone, a battery, a microphone pre-amplifier, a power amplifier, and a receiving (reproducing transducer) coupled through a tube to a port configured to fit within the ear canal;

FIG. 7 is a plan view of a represetative state-of-the-art miniature Class B power amplifier;

FIG. 8 is a side elevation of the amplifier shown in FIG. 7;

FIG. 9 is a plan view of a state-of-the-art receiver designed to fit within a hearing aid of the type shown in FIG. 5, and showing in dotted outline the interior volume dedicated to the transducer motor and its associated armature;

FIG. 10 is a side elevation of the receiver of FIG. 9, further showing an interior partition separating the lower motor compartment from an upper output compartment coupled to provide acoustical energy to an output port;

FIG. 11 is a plan view of the complete power amplifier of the present invention, consisting of an encapsulated chip mounted on a chip carrier and having lead attachment pads periherally disposed thereon;

FIG. 12 is a side elevational view of the amplifier of FIG. 11;

FIG. 13 is a plan view of a miniature inductor used in conjunction with the amplifier of FIGS. 11 and 12;

FIG. 14 is a side elevation of the inductor shown in FIG. 13;

FIG. 15 is a plan view of the receiver shown in FIG. 9, showing the amplifier of FIGS. 11 and 12 and the inductor of FIGS. 13 and 14 emplaced therein, the new components being similarly shown in dotted outline; and FIG. 16 is a side elevation of the newly configured receiver of FIG. 15.

Figure 1:
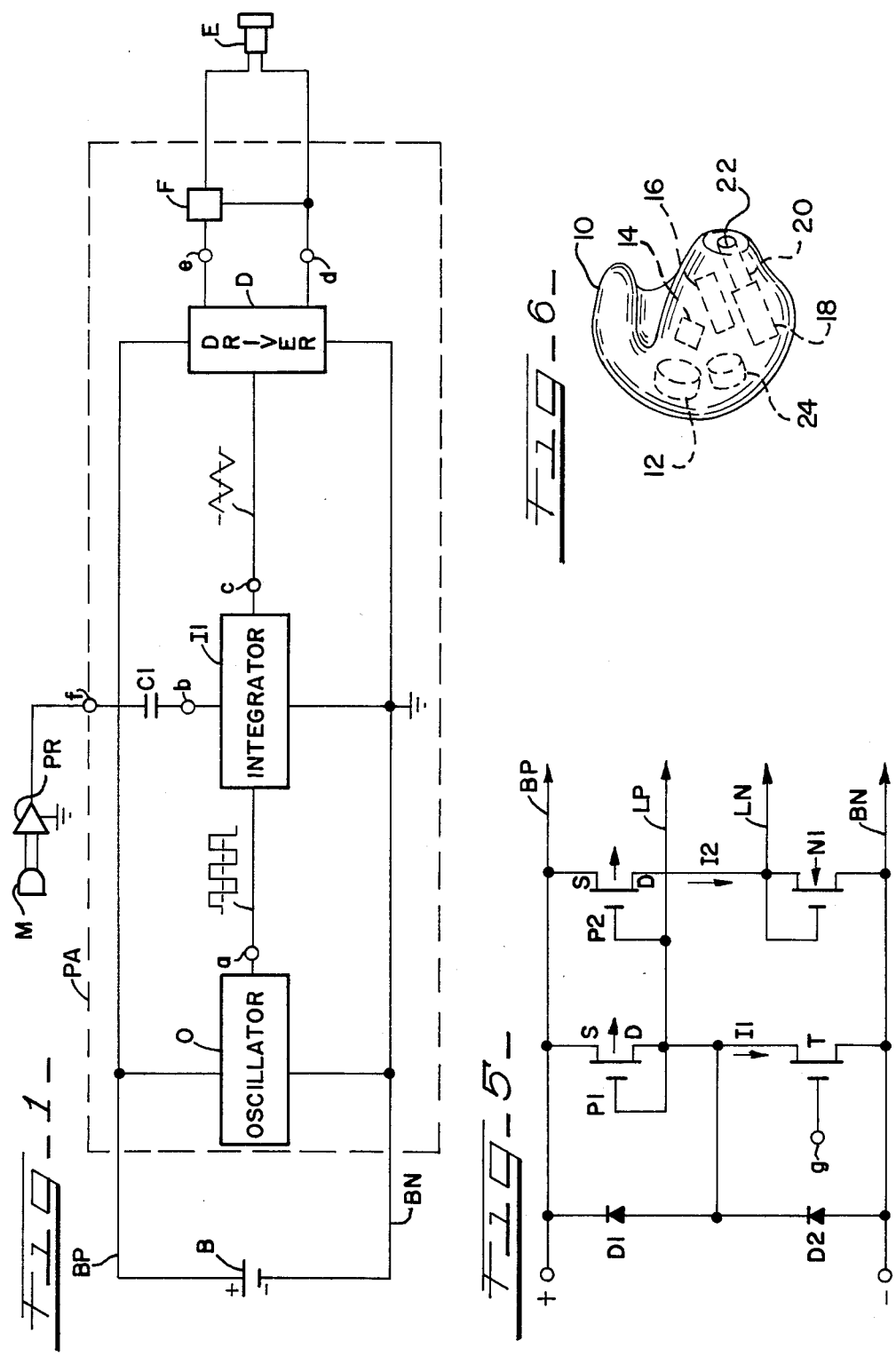
FIG. 1 is a functional block diagram of the amplifier system, showing in particular the interconnection and function of an oscillator, a biased integrator, a switching driver and an output filter.

NOTE: All elements shown in FIGS. 7-16 are to an identical scale as indicated at the bottom of the drawing by a scaling line carrying a pair of markings indicating a one-tenth inch length thereof.

DESCRIPTION OF INVENTION

While this invention is susceptible of embodiment in many different forms, there is shown in the drawings and will herein be described in detail a preferred embodiment of the invention with the understanding that the present disclosure is to be considered as an exemplification of the principles of the invention and is not intended to limit the broad aspect of the invention to the embodiments illustrated.

The present invention is concerned with a hearing aid power amplifier for amplifying signals from a microphone preamplifier and delivering them to an earphone load. FIG. 1 is a block diagram of the overall amplifier system, with the power amplifier system of the present invention enclosed within rectangle PA. Audio signals picked up by a microphone M and amplified by a pre-amplifier PR, both of conventional hearingaid design, are fed to the amplifier input terminal "f" to be amplified and sent to an output earphone E connected through an optional filter F to output terminals "e" and "d". The earphone E consists of a transducer motor contained within a transducer housing suitably ported to communicate with the ear canal. Throughout this application the terms "earphone", "transducer", and "receiver" will be used interchangeably unless otherwise specified to denote the element shown functionally identified as earphone E in FIG. 1.

A 1.2 to 1.5 volt battery B powers a system positive bus labeled BP and a system negative bus labeled BN. Oscillator O, also schematically illustrated in two embodiments in FIGS. 2 and 3 and discussed in detail further on, drawing its power from the positive and negative buses BP and BN, produces at its ouput node "a" a symmetric square wave at ultrasonic frequency, and having its voltage excursion ranging from the potential of the negative bus BN to the potential of the positive bus BP. Thus, approximately 1.2 to 1.5 volts amplitude swing is represented in the output wave train seen at node "a". A biased integrator I, also schematically illustrated in FIG. 4 and to be discussed in detail further on, processes the input waveform received from node "a" to produce a triangular waveform at its output node "c".

Figure 4:
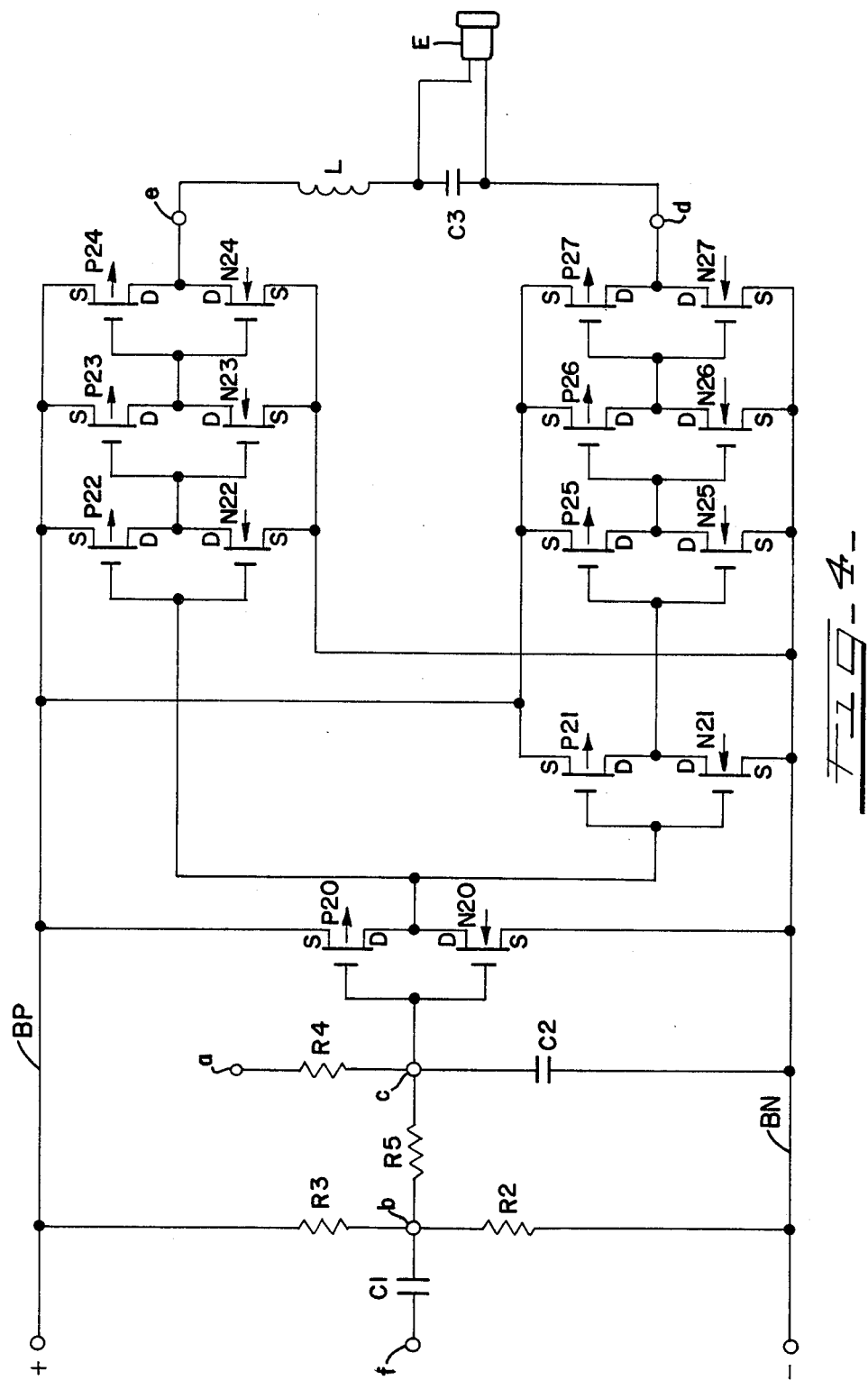
FIG. 4 is a schematic view of the biased integrator, switching driver and filter circuit of FIG. 1.

An audio frequency bias signal representing the audio frequency voltage derived from the pick-up microphone "M" is coupled through capacitor C1 to biasing node "b", and causes an additive shift of the triangular waveform produced by the integration process at the output node "c" of the biased integrator I. The subcircuit for accomplishing this is shown in FIG. 4, and will be discussed in detail further on. In the absence of an output from the microphone M, the output triangular waveform from the biased integrator I at node "c" is symmetrically disposed in amplitude about the "axis crossings". The term "axis crossing" will be used for the moment to denote waveform crossing excursions through a threshold potential value midway between the potential of the two power buses BP and BN, i.e., approximately 0.6 volts positive with respect to the negative bus. An audio frequency biasing signal received from the preamplifier PR will cause the triangular waveform seen at node "c" to shift up and down responsive thereto so as to shift the time interval between axis crossings.

A switching driver D, also schematically illustrated in FIG. 4 and to be discussed in detail further on, connected across system buses BP and BN, and deriving its power therefrom, takes as its input signal the waveform developed at output node "c" of the biased integrator, and switchingly connects its output nodes "e" and "d" to the positive and negative supply buses BP and BN respectively during the duration of the period between positive axis crossings. During the period between negative axis crossings, the connectivity of nodes "e" and "d" is reversed, connecting output node "e" to the negative bus BN and node "d" to the positive bus BP.

In the absence of a biasing voltage derived from the microphone M, the input to the switching driver D is a triangular wave of equal excursion, and hence of equal interval between axis crossings, resulting in a square wave voltage waveform being developed between nodes "e" and "d" of magnitude equal to approximately twice the battery voltage. In this respect, it will be noted that the switching driver acts very much as a simple polarity reversing switch. As previously stated, the audio frequency signal from the microphone M shifts the axis crossings, and thus causes the output voltage developed nodes "d" and "e" to be a pulse modulated train, the modulation of the pulse widths constituting pulse duration modulation. As in well-known in the art, as long as the oscillator frequency is at least twice the frequency of the highest audio frequency component, the resulting frequency spectrum has an audio frequency portion constituting a facsimile representation of the voltage developed by the microphone, as well as ultrasonic frequency components derived from the switching action induced by the oscillator O.

The earphone E is connected to the output nodes "d" and "e" through an interposed filter F, the filter F being designed to be as purely inductive as possible at the lowest component of the ultrasonic spectrum present at nodes "e" and "d", and to be either substantially transparent to the audio frequency ranges, or alternatively to provide audio high frequency "tailoring," e.g. augumented high frequency audio response known to be useful in the case of certain classes of hearing defects, or to overcome inherent drop in high frequency response of substantially inductive earphone loads when driven by voltage sources.

The switching driver D is designed to present very low switching impedance between the buses BP and BN and the output nodes "d" and "e", with the result that if the output load between "e" and "d" is purely inductive at switching frequencies the energy stored in the filter F in each-half cycle is returned to the system battery B so that minimal net system power drain from the battery is dissipated.

Figure 2:
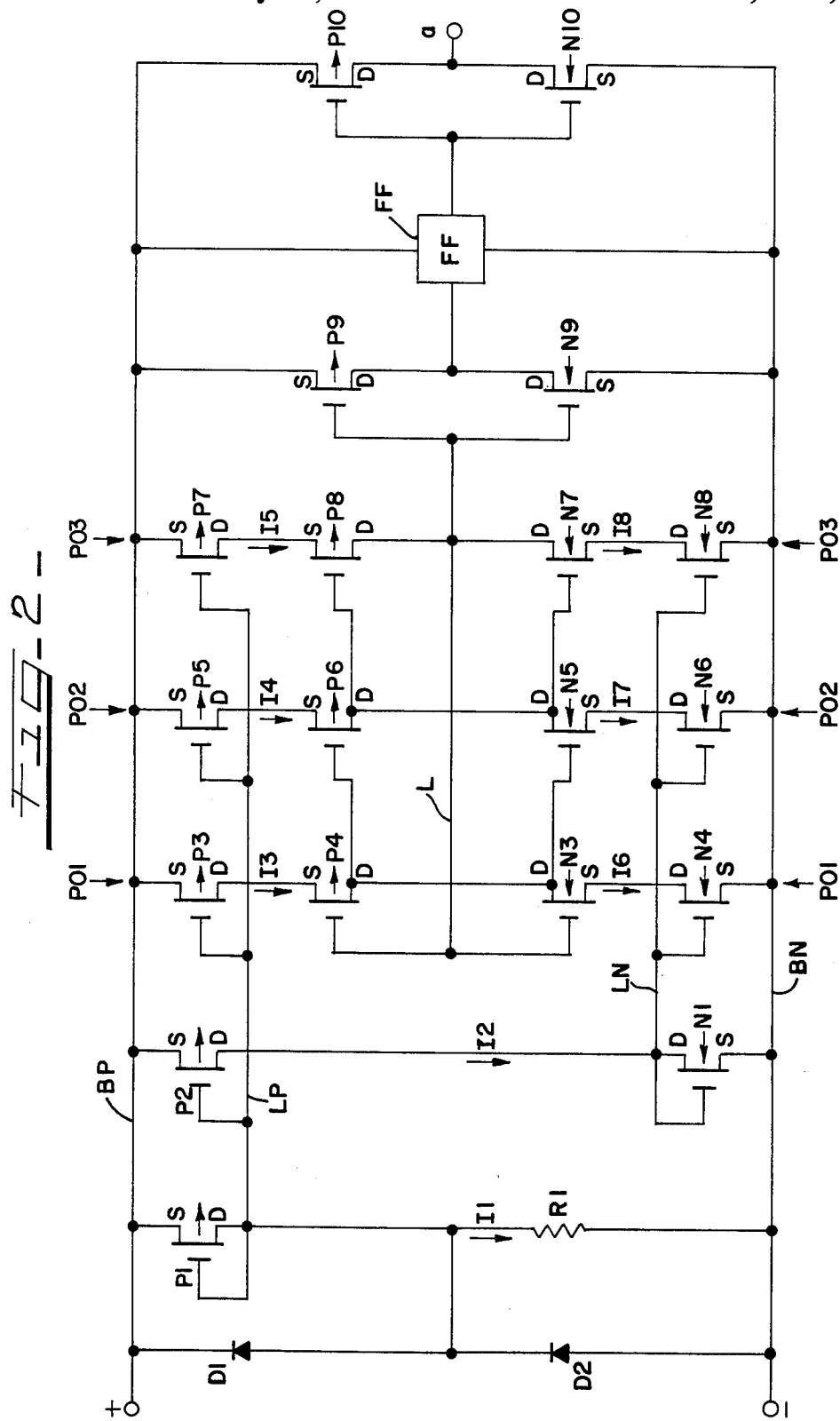
FIG. 2 is a schematic drawing of one form of oscillator circuit of FIG. 1.

Considering the circuits next in more detail, FIG. 2 is a schematic diagram of one version of the oscillator circuit represented as O in FIG. 1. The oscillator is configured in the form of a three-stage ring oscillator, each stage consisting of a switching pole of two complementary pairs of PMOS and NMOS transistors arranged as a PMOS upper half-pole, eg. P3 and P4 and a lower half-pole N3 and N4.

In the upper half pole the source of transistor P3 is connected to the positive bus BP, and its drain is connected to the source of P4. Similarly, in the lower half-pole the source of N4 is connected to the negative buses BN, and its drain is connected to the source of N3. The drains of P4 and N3 are connected together to form the output terminal of stage P01. The input elements of a given pole are the mutually connected gates of, for example, transistor P4 and transistor N3. All transistors in this version of the oscillator and in all remaining circuitry to be subsequently discussed are either PMOS or NMOS transistors with channel threshold potentials preferably adjusted so that they operate in the enhancement mode.

The input to the upper and lower halves of this pole is applied simultaneously to the gates of P4 and N3. The common interconnection of the drains of the driver transistors P4 and N3 drives the inputs of the next stage, i.e. the gates of driver transistors P6 and N5. Thus, during operation, the switching of the upper and lower poles of a given stage serves alternately to charge and discharge the gate capacitance of the next stage. The output of the third pole P03 is fed back to the input of the first pole P01 via a line L, the configuration thus comprising a ring oscillator characterized by an output frequency governed by the sum of the individual charging times of the gates of the input transistors of each pole, for example P4 and N3 of pole P01 which in turn is governed by the magnitude of the charging current, e.g., I3, delivered by the driving stage to the driven gates.

Substantially the entire current drawn from the battery by these three stages P01–P03 is represented by the current flow necessary to charge and discharge the individual input gates. The charging current, and hence the frequency of oscillation is controlled by the current limiting action of P3, P5, P7, N4, N6, and N8 interposed between the sources of their respective driver transistors and signal ground, i.e. battery buses BP and BN. Their effective resistance, governing the upper and lower half-pole current flows respectively, are controlled by common gate biases supplied by lines LP and LN. Thus, adjusting these biases will vary the oscillator frequency.

As will subsequently be discussed, it is desirable that the frequency of the oscillator be adjustable in the manufacturing process to a preset value, depending upon the characteristics of the output load represented by the earphone E and the filter F. A substantial simplification is achieved in the circuit of FIG. 2 by employing a double current mirror to control the switching currents in the upper and lower halves of each switching pole to substantially identical values, and to control this value by a single resistor which can be trimmed during manufacturing to a permanently established value to set the frequency to the chosen value.

In the circuit of FIG. 2, this is accomplished by means of a pair of current mirrors employing transistors P1, P2 and N1. The first current mirror consists of transistors P1 and P2 operating in conjunction with resistor R1. Transistor P1 has its source connected to the positive bus BP, with its gate and drain interconnected and returned to the negative bus BN via a resistor R1. By varying the value of resistor R1, the current I1 through the first transistor P1 is established at a chosen value. Transistor P2, having its source connected to the positive bus BP, and its gate connected to the gate of P1, thus has the same gate-to-source bias as P1, and hence repeats the value of current I1 as I2 supplied to a load represented by the drain of N1, transistor N1 having its gate connected to its drain and its source connected to the negative bus BN to serve as a second current mirror, as will be shown next.

Insofar as the upper half-pole currents I3, I4, and I5 are concerned, since the sources of P3, P5, and P7 are connected to the positive bus BP, and their gates are all connected to gate of P2, their gate-to-source bias is identical to that of P2, and to the extent that they have substantially indentical channel properties, these currents will be equal during the charging process. Simularly, since the lower current regulators N4, N6, and N8 all have their sources connected to the negative bus BN and their gates connected to the gate of N1, their gate-to-source bias is identical to that of N1, as set by I2, and it follows that these currents are also equal to I2.

Since I2 is a replica of I1, it follows that, within the limits previously stated, the requisite results are obtained in that the charging currents in the upper and lower halves of each pole are identical to each other and are substantially the same in all three stages. By varying the resistor R1, all six currents are held to substantially the same value, whereby the frequency of oscillation of the entire system is determined by one resistor alone. Protect diodes D1 and D2 at the input of the oscillator D circuit are added to provide electrostatic protection for the gates.

The output of the oscillator is taken from the interconnected drains of transistors P8 and N7, and is in the form of a roughly square wave.

Transistors P9 and N9 comprise a conventional complementary pair switching buffer circuit which is driven by the oscillator and drives a divide-by-two flip-flop FF, this element being of conventional design. In this way, a nearly exact 50 percent duty cycle is obtained even if the output of the current controlled oscillator is asymmetrical. The output of the flip-flop FF drives a complementary pair CMOS buffer transistors P10 and N10 to provide relatively low output impedance and minimum rise and fall time at the output (See FIG. 1 node "a") of the oscillator circuit.

Figure 3:
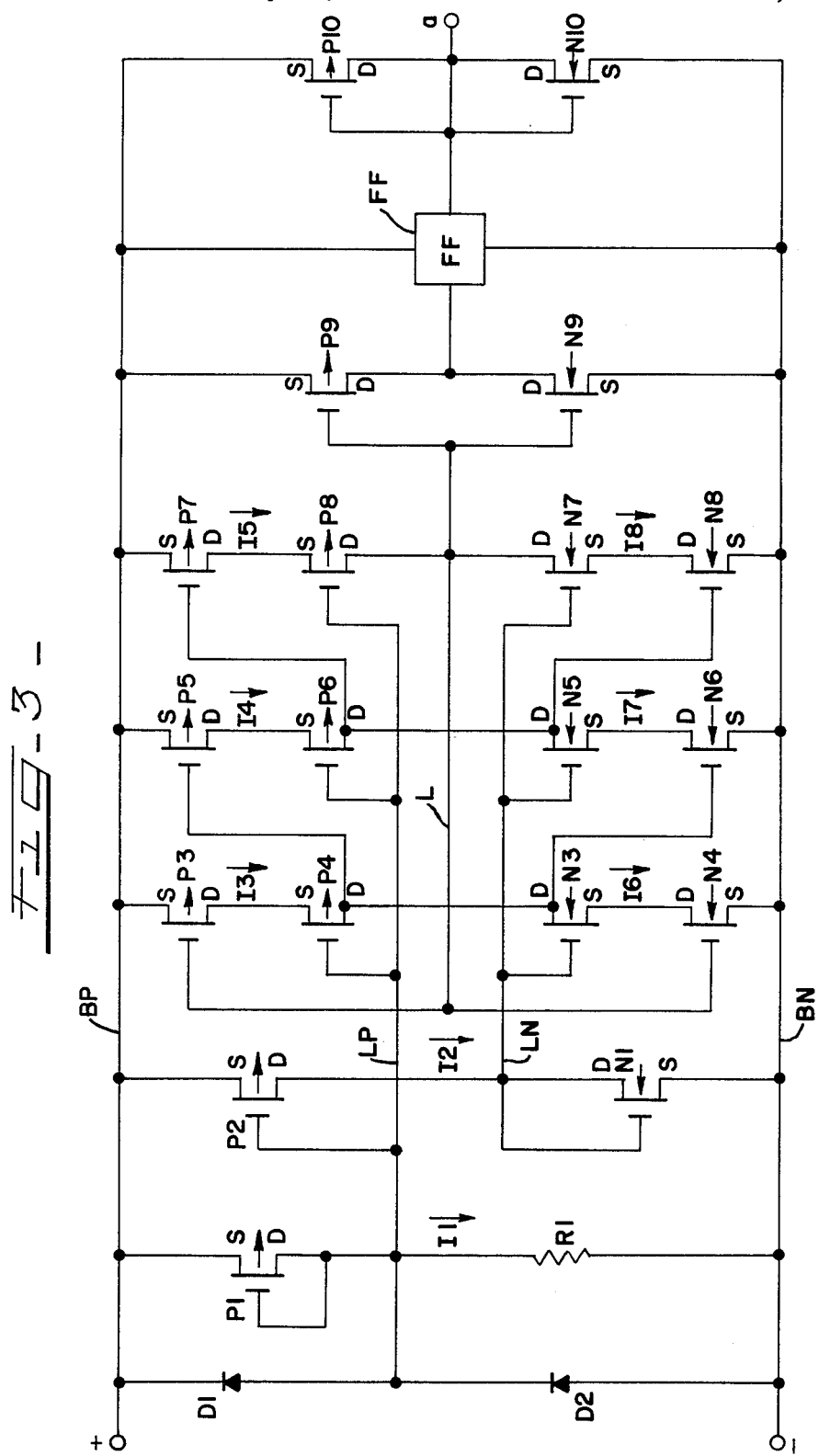
FIG. 3 is a schematic drawing of an alternative oscillator circuit.

Another emboidment of the oscillator circuit is shown in FIG. 3. In contrast with the previous osillator scheme of FIG. 2, which was analytically a system of driver transistors with controlled source degeneration for frequency control, the circuit of FIG. 3 consists of a CMOS three-stage ring oscillator, as before, but wherein each half-pole is configured as a cascode amplifier with an active load element. The circuit is identical with that of FIG. 2, except that the input of each pole is the common interconnection of the gates of the driver transistors P3-N4, P5-N6, and P7-N8, and the current control bias lines LP and LN are connected to the gates of P4, P6, P8 and N3, N5, N7 respectively.

Thus, referring to FIG. 3, P3 is a grounded-source driver driving the source of P4. Controllable bias applied to the gate of P4 via line LP controls the half-pole charging current to the gates of the next stage. Similar considerations apply to the lower half-pole elements N3 and N4. The principal advantage of such a circuit lies in lower charging current, and hence battery drain, at a given frequency. The charging capacitances represented by the gates of P5 and N6 are effectively isolated from the outputs of the driver transistors P3 and N4, with the result that they do not reflect back by feedback to give rise to augumented input capacitance at the gates of P3 ad N4. This is in contrast to the circuit of FIG. 2, wherein such feedback action (Miller effect) is only partially offset by gain reduction arising from source degeneration. Since, as previously discussed, the principal current drain of the three poles constituting the oscillating ring is the gate charging current, it follows that, for a given frequency, the cascode oscillator is even more current efficient than the circuit of FIG. 2 at a given frequency of oscillation.

The current mirror system controls the gates of the load transistors, eg. P4 and N3, to control the charging current via biasing lines LP and LN derived from a double current mirror involving transistors P1, P2, and N1, as before. Since the drive transistors P3 and N4 are switched to a highly conducting state in the "on" condition as compared to their loads P4 and N3, there is negligible source-to-drain drop across them, and the gate-to-souce voltage of the load transistors closely replicates that of the respective current regulators P2 and N1, again resulting in substantially equal half-pole currents in all stages, the current again being controlled by the value of R1.

Since in both oscillator circuits the adjustable frequency determining element is a single resistor, it is clear that a more general application of the foregoing principles allows the fabrication of a voltage-controlled oscillator simply by replacing resistor R1 of FIGS. 2 and 3 by a controllable element, such as a field effect transistor T as shown in the partial circuit of FIG. 5 modifying the double current mirrors of FIGS. 2 and 3. By making the source-drain path the controlling resistance element, the resistance, and hence the frequency of oscillation, may be varied at will by a potential applied to node "g" connected to the gate. For hearing aids, however, it is preferred to use a trimmable fixed resistor for this element, since the frequency, once established, need not be varied. Considerations governing the optimum choice of frequency will be discussed subsequently.

FIG. 4 shows the schematic diagram of the biased integrator I, switching driver D, filter F and the associated earphone load E of FIG. 1. Interconnection nodes "a", "b", "c", "d", "e" and "f" of FIGS. 1, 2 and 3 are similarly labeled in FIG. 4. The square wave output of the oscillator at node "a" is integrated by resistor R4 feeding capacitor C2 so that an approximatey triangular waveform is produced at node "c". An advantage to CMOS circuitry is that the voltage drop across an unloaded "on" transistor is essentially zero. Thus, the open circuit voltage of the oscillator buffer, as seen at node "a", swings from ground (negative supply) to the positive supply. The approximately triangular waveform at node "a" will thus be symmetrical and have an average value that is within a few millivolts of one-half the supply voltage if (1) the output resistances of the two buffer transistors P10 and N10 (FIGS. 2 and 3) are well-matched, or small compared to the load resistance presented by integrating resistor R4; (2) resistors R2 and R3 are well-matched; and (3) there is no audio frequency signal present at node "b".

A comparator is formed from a complementary pair of NMOS of PMOS transistors P20 and N20 connected in similar fashion as the oscillator output buffer P10 and N10 of FIGS. 2 and 3. If P20 and N20 have the same threshold voltage, the "decision voltage" at the comparator input "c" will be equal to one-half of the supply voltage. Under these conditions, the triangular waveform at node "c" will, after amplification and clipping by speed-up CMOS switching inverters P21–P27 and N21–N27, result in a symmetrical square wave output of 50 percent duty cycle at node "d", with the complementary output at node "e". The inverter stage consisting of the complementary pair of switching transistors N21 and P21 provides the requisite inversion necessary to make the output voltage at node "d" out of phase with that of node "a". Since these two phases are inverted, it follows that the peak-to-peak voltage developed between nodes "d" and "e", and hence across the load, is essentially twice the battery voltage.

Because the duty cycle is 50 percent, at nodes "d" and "e", the average voltage at each of these nodes will be equal to one-half the supply voltage, as discussed above. If an earphone is placed between the two outputs, i.e., connected to nodes "d" and "e", the average, i.e., net D.C., current through the earphone will be zero.

In the practical case, the threshold voltages of the PMOS and NMOS transistors P20 and N20 will not be exactly equal, so that the comparator decision voltage will not be equal to one-half the supply voltage. With the circuit as decribed above, the result will be that the output duty cycle will not be equal to 50 percent, and an undesirably large net direct current in the earphone E, with a consequent loss in efficiency, can result under zero audio signal conditions. If the greatest yield in the production of the monolithic CMOS chips is desired, however, it may be desirable to accommodate as large a range of comparator decision voltages as from one-third to two-thirds of the supply voltage. This may be done by adjusting a supplemental input biasing network formed by R2 and R3 connected across the power buses BP and BN to provide a chosen d.c. potential at their juncture node "b", this potential being used to bias the integrator output terminal "c" to a chosen value via resistor R5, thus providing the desired accommodation to production variations in threshold voltages. Either resistor R2 or R3 may be trimmed, eg. by laser trimming, to establish proper bias.

If now an audio microphone signal is added at the input node "f", that signal voltage will add to the triangular wave voltage at node "c", shifting the "axis crossings", and the complementary square wave output at nodes "d" and "e" will no longer have a 50 percent duty cycle. With the circuit properly adjusted for zero D.C. signal output in the absence of audio signal, the application of such an audio signal at node "f" will cause the duty cycle of the square wave output at nodes "d" and "e" to change in a proportional manner, with the result that the average voltage difference between nodes "d" and "e", and the signal current through the earphone E, will be linearly related to the input signal waveform, as is well understood by those skilled in the art of Class D amplifiers. It is important to note that a Class D amplifier of this type is inherently linear under small signal conditions, being totally free of the cross-over distortion that typically characterizes most Class B amplifiers. Nonlinearity in Class D operation is normally seen only for large signal extremes.

If the earphone E is connected directly between the complementary output nodes "d" and "e", an alternating current at the switching frequency will flow through the earphone coil. If the impedance of the load at these nodes is purely inductive, and the "on" resistance of the output switches is negligible, the net drain on the battery due to this alternating current would be zero, since the energy stored in the inductance of the earphone coil during one portion of the wave form would be returned to the battery during the succeeding portion.

In practice, however, there are associated eddy-current losses in the magnetic structure, these losses increasing with frequency. If however, a supplemental low-loss inductor having a ferrite or powder core is inserted in series with the earphone, then a substantial reduction in such losses would occur, adding to the power efficiency of the system by reflecting ultrasonic power components back to the battery. This is the principal function of the filter F shown in FIG. 1, and as represented by L and C3 of FIG. 4, as will be discussed.

In practice, the switching frequency impedance presented by the earphone input is that of an inductor having some losses and shunted by the inter-winding capacitance of the coil, and thus, for the previously-stated reasons, only a portion of the energy delivered to the earphone coil at the switching frequency will be returned to the battery. The energy stored in the interwinding capacitance, which is an energy that is stored almost instantly at each switching transition, is lost to dissipation in the resistance of the output transistors. Fortunately, with low-impedance earphones, the interwinding capacitance can be made relatively small and thus will generally be a negligible portion of the total energy loss.

If the effective series resistance of the earphone were of a fixed value with respect to frequency, then increasing the switching frequency, i.e., the oscillator frequency, to an appropriately high value could cause the earphone to present a more nearly inductive load to the driver above the switching frequency. The advantage expected to be gained from such an approach is to some extent limited, since the dissipation term in the earphone input impedance is not constant, but rises with increasing frequency. This rise is generally less than linear with frequency, and at sufficiently high frequencies the impedance is substantially inductive. A reduction in battery drain arising from load dissipation can thus be achieved by increasing the switching frequency.

This reduction is offset somewhat, because raising the switching frequency adds another contribution to the average battery drain, as all gate capacitances are charging and discharging at a rate proportional to frequency. In practice, using available earphones and conventional 6-7 micron metal gate CMOS technology, a frequency of about 100 KHz gives rise to an idling current of about 140 microamperes for the circuit represented by the oscillator of FIG. 3 and the circuit of FIG. 4 with a 600 ohm hearing aid earphone connected directly across nodes "d" and "e". In this arrangement, the earphone properties are acting as a filter.

An improvement over this idling current value can be secured by inserting a properly configured reactive filter consisting of the series inductor L and the shunt capacitor C3, as shown. The inductor winding is of the ultraminiature low-loss type disclosed in U.S. Pat. No. 3,182,384 issued to Carlson and Pyle. The inductor winding is carried on a ferrite core, the entire inductor L occupying a volume of approximately 0.0003 cubic inches. The condition placed upon the value of inductance L is that the impedance presented at a chosen switching frequency by the series combination of inductor L and earphone E be substantially inductive. Shunt capacitor C3 acts to conduct the switching harmonics around the earphone and its dissipative losses. This permits the use of a physically smaller inductor, since the inductive reactance at the switching frequency can be correspondingly reduced.

The filter, if properly dimensioned at the chosen oscillator frequency, can be designed to present tolerable series and shunt insertion effects at audio frequencies, and presents the desired inductive load at the switching frequency and above.

With the values of 32 millihenry for L, 0.1 microfarad for C3, using a nominal 600-ohm miniature earphone, and with an oscillator frequency of 40 KHz, a total idling current of less than 50 microamperes is observed, as compared with the unfiltered 100 KHz configuration previously described. This is also to be compared with the typical idling currents of 500 microamperes or more routinely found in inexpensive commercial class B circuits intended for hearing aid applications. The audio quality of the Class D amplifier at low listening levels is characterized by a total harmonic distortion content of about 0.5%, and at 500 Hertz 110 dB sound pressure level in the distortion rises to approximately 5%. The cited distortion levels are both well below audibility on speech and music sounds, as discussed at some length on pp. 66–75 of the publication DESIGN AND EVALUATION OF HIGH FIDELITY HEARING AIDS, by Mead C. Killion (Northwestern University Ph.D. Dissertation, June, 1979, University Microfilms #7917816, Ann Arbor, Mich.). Thus the Class D amplifier described herein can be used in the highest-fidelity hearing aids without audibly degrading the reproduced sound.

The particular values of inductance L and capacitance C3 were chosen to provide a deliberate augmentation of earphone response at about 3 kilohertz. Since the output of the switching driver approximates a voltage source of negligible impedance, the previously mentioned inductive property of the earphone E, causing the earphone impedance to rise with frequency, causes the acoustical power output thereof to drop at the higher audio frequencies.

The impedance of the earphone employed may be approximated at the higher audio frequencies as an inductance of about 30 millihenries in series with a dissipative element of several hundred ohms. By resonating the parallel combination of the earphone E and filter inductor L with the capacitor C3 at about 5 kilohertz, an increased drive current is supplied to the earphone branch of the network, resulting in substantial augmentation of high frequency response. The aforementioned values resulted in an output increase of approximately 5 dB at about 3 kilohertz as compared to the same circuit without the resonating capacitor C3. The filter circuit thus serves the double function of returning switching harmonic power to the battery and improving impedance matching to the load at chosen frequencies to tailor the audio response.

Thus, a class D hearing aid power amplifier circuit has been described which not only provides the anticipated reduction of audio signal distortion at low signal levels in comparison with conventional class B systems, but which operates with a reduced idling current as well. As will be evident to those skilled in the art, the circuits represented by FIGS. 1, 2, 3, and 4 can be fabricated by well-known single-chip technology using fired-on resistors R1-R5 on the chip carrier itself, to be trimmed to prescribed values, and with only inductor L, and capacitor C3, as discrete components. Additionally, the need for a series blocking capacitor between earphone and driver is eliminated without requiring expensive or space-consuming balancing circuits normally encountered in class B systems. The entire power amplifier with the optional filter inductor L occupies a total volume of 0.007 cubic inches, the filter capacitor C3 occupying trivial volume.

With the exception of the input coupling capacitor C1 and the output filter consisting of L and C3, all of the discrete components R1 through R5 and C2, as shown in FIGS. 2, 3 and 4, have values suitable for incorporating into a monolithic integrated circuit or onto its associated carrier. In one embodiment, all of the above-mentioned discrete components R1-R5 and C2 are fired onto a 0.005-inch-thick ceramic substrate (chip carrier) using "thick film" technology. Capacitor C1 has the value 0.01 microfarads and is readily available as a 0.018 inch thick by 0.050 inch by 0.040 inch chip capacitor which can be accommodated within the earphone housing or included elsewhere as part of the conventional preamplifier of the hearing aid. The remainder of the circuit components were contained on a custom monolithic CMOS chip that was bonded to the thick film hybrid circuit. Since most chips from one wafer have similar decision voltages, it was generally necessary to adjust only R2 or R3, but not both, on any given production lot.

FIG. 6 shows a complete hearing aid contained within a housing 10, representing the kind of hearing aid which the present amplifier is designed to improve. The housing 10 contains elements shown in dotted outlines in symbolic form, the elements comprising a microphone 12, a battery 24, a microphone pre-amplifier 14, a power amplifier 16, an earphone (receiver) including a transducer 18, a tube 20 connected to an output point thereof, the tube 20 in turn being connected to a hearing aid output port 22 disposed to communicate with the ear canal when the housing 10 is properly inserted. The components shown in FIG. 6 are shown substantially undersized with respect to the housing 10 so as to show them in isolated location. In practice, they are very closely placed with respect to each other, and substantially fill the entire useable volume contained within the housing 10. In particular, the power amplifier 16 and the transducer 18 occupy a substantial volume in themselves.

Some estimates of the size problems in such a hearing aid can be obtained by comparing a representative state-of-the-art Class B amplifier the model LTI-549, made by Linear Technology Corporation (Elk Grove, Minn.), and as shown in two views in FIGS. 7 and 8, in comparison with the two views shown in FIGS. 9 and 10 representing the overall outline of a state-of-the-art earphone transducer in its associated housing. The example shown is the Model BK1600, manufactured by Knowles Electronics, Franklin Park, Ill., and is a modified version of the receiver disclosed in U.S. Pat. No. 3,588,383. All drawings, FIGS. 7–16, are drawn to a common identical scale indicated by the scaling line in the drawings.

With particular reference to FIGS. 7 and 8, the Class B amplifier there shown and generally represented by the number 24 consists of an amplifier chip 28 mounted to a chip carrier 26, and having two associated feedback capacitors 30—30 mounted thereon as well. The general overall dimensions of the Class B amplifier are approximately 0.090"×0.250"×0.300". It will be noted in particular that the capacitors 30—30 occupy a substantial volume of the amplifier system 24, however, it should be recognized that this amplifier additionally contains a preamplifier, and that the capacitors are associated with stabilization of the entire amplification system. Thus, the size comparison between the Class B amplification system shown in FIGS. 7 and 8 and those elements shown in FIGS. 11–16 is for informational purposes only.

The Class B amplifier of FIGS. 7 and 8 is to be compared with the receiver 32 shown in FIGS. 9 and 10, the receiver including a receiver housing 36, an internally disposed transducer shown generally in dotted outline 40 and having associated therewith a resilient armature element 42, the housing being divided into upper and lower chambers 50 and 48 by means of a septum wall 46. Application of signal input to terminals 38 actuates the transducer motor 40 to move the armature 42, the armature 42 being coupled by means (not shown) to actuate a diaphragm (also not shown) disposed immediately above the septum wall 46 to produce a sound output in the upper chamber 50 to be communicated through a port 52 to the output 34 of the receiver.

FIGS. 11 and 12 are, as previously stated, drawn to the same scale as FIGS. 7–10. They show the Class D amplifier assembly, generally designated 54 and consisting of a chip carrier 60 supported on an upper surface thereof, the CMOS chip being shown in dotted outlines 62 and being completely enclosed by an encapsulation 56. Peripheral metalized terminals 58 are provided for lead attachment. Resistors R1–R5 and capacitor C1 are discrete components fabricated on the chip carrier 60, and are beneath the encapsulation 56, and hence invisible. The overall dimensions of the Class D amplifier Assembly 54 are approximately 0.30"×0.155"×0.095". FIGS. 15 and 16 show the preferred location of the amplifier assembly 54 of FIGS. 11 and 12 disposed within the receiver housing 36, and mounted on the left-hand wall of the transducer motor assembly 40.

FIGS. 13 and 14 show similarly scaled views of an inductor built along the principles disclosed in the previously mentioned Carlson-Pyle patent. The inductor is generally designated 64, and consists of a closed frame 66 having a winding 68 disposed on one leg thereof. Again, with reference to FIGS. 15 and 16 it will be seen that the inductor 64 can be accommodated to one side of the armature 42 within the receiver housing 36. It will also be noted with respect to FIGS. 15 and 16 that additional terminals 38' have been provided to accommodate the increased terminal requirements necessitated by placing the two elements 54 and 64 inside of the receiver housing 36. In terms of the circuitry as described herein, only three terminals 38' are necessary, two for battery power (one acting as ground), and one for signal input.

Thus, it has proven possible not only to produce a power amplifier of reduced low level distortion properties and very low idling current, but it has also proven possible to mount the amplifier as well as the optional energy-conserving inductor within a state-of-the-art earphone housing. The optional additional filter element capacitor C3 previously described may readily be accommodated in the position conjugate to that of the inductor 64 with respect to the armature 42, as may be seen by reference to FIG. 15.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to a particular embodiment disclosed as the best mode contemplated for carrying out the invention, but that the invention will include all embodiments falling within the scope of the appended claims.

In particular, whereas the particular embodiments herein presented have been drawn to a hearing aid, the system concepts of the amplifier and filter may equally well be employed in a large class of amplifying devices requiring extremely low power.

I claim:

1. In a hearing aid having a microphone, a power amplifier, and an output receiver transducer, said power amplifier being coupled to receive audio frequency input signals produced by said microphone and to drive said transducer in response to the input to said microphone, the improvement wherein: said power amplifier is of the pulse-width modulation type, and in response to the absence of an input signal from said microphone said power amplifier couples to said transducer an alternating electrical signal pulse train of positive and negative electrical pulses of substantially zero average value at an ultrasonic frequency, said amplifier including means for controlling the time duration of said positive and negative electrical pulses responsively to the amplitude of the audio frequency signal applied to the input of said power amplifier so as to provide to said transducer an audio frequency facsimile of said input signal.

2. Apparatus as in claim 1 further including a battery and filter means electrically interposed between said power amplifier and said transducer for allowing said audio frequency facsimile of said input signal to be delivered to said transducer, said filter means presenting to the output of said amplifier a substantially inductive characteristic at said ultrasonic frequency and the principal harmonics thereof, to thereby reflect a substantial fraction of the power contained in ultrasonic frequencies back to said battery to minimize the current drain on said battery, said filter means including an inductor electronically interposed between said power amplifier and said transducer.

3. An integrated circuit class D hearing aid power amplifier for amplifying audio frequency input signals and for driving a receiver transducer connected thereto, said amplifier having complementary metal oxide semiconductor (CMOS) output devices driven in switching mode, said amplifier including an oscillator for providing signals controlling the switching of said output devices, said switching oscillator comprising cascaded CMOS switching stages configured as a ring oscillator, each stage including first and second current control elements governing stage output rise and fall time respectively, a first and a second current mirror, said first and second control elements being controllably responsive to said first and second current mirrors respectively, said oscillator further comprising a resistance means connected to establish the current provided by said first current mirror, said second current mirror connected to said first current mirror to provide a replica of the current provided by said first current mirror, whereby said rise and fall times are substantially equal to provide symmetric operation at low current drain and so that the frequency of oscillation is controllably responsive to the value of said resistance means, said frequency of oscillation being chosen to be a multiple of the desired switching frequency, and means for dividing the oscillator output by said multiple to obtain symmetry of the oscillator output waveform.

4. The amplifier of claim 3 wherein said oscillator stages comprise driver transistors connected to their respective current control elements at their respective sources so that said control elements provide a current limiting action by controlling source degeneration.

5. The amplifier of claim 3 wherein said oscillator stages comprise driver transistors connected at their respective drains to their respective current control elements so that said control elements provide a current limiting action.

6. Apparatus as in claim 3 wherein said oscillator produces an ultrasonic square wave, said amplifier including a biased integrator receiving said square wave and producing therefrom a triangular waveform output, said triangular waveform having voltage level axis crossings which are controlled by a bias applied to the integrator, said bias being produced responsively to said input signal said integrator shifting said axis crossings of the triangular waveform from a quiescent symmetric condition responsively to said input signals, the amount of unbalance both in sign and magnitude being a continuously varying function of the amplitude of the input waveform.

7. Apparatus as in claim 6 wherein said output devices of said amplifier are configured as a balanced CMOS switching driver having a pair of output terminals associated therewith, the axis crossings of the integrator output waveform being used to control the time duration and the polarity of the output of said driver, said driver producing positive and negative switching pulses which vary according to the time intervals between axis crossings at the integrator output, thereby providing a pulse modulated signal having a frequency spectrum in the audio band representing a facsmile of the waveform supplied to the input of said amplifier.

8. Apparatus as in claim 7 wherein said amplifier comprises an integrated circuit and a chip carrier for said integrated circuit, said amplifier further including a supplemental biasing network including a resistor serving as a balance control means, said switching driver output being balanced by controlling the value of the single resistor so as to provide zero d.c. output current under zero audio input signal conditions, said supplemental network comprising fired-on resistors on said integrated circuit chip carrier.

9. Apparatus as in claim 8 further including a reactive filter coupled to the output of said switching driver so as to be interposed between said driver and said receiver transducer, said filter having the property when coupled to a representative receiver transducer that as seen from the driver the resulting driver load appears substantially inductive at said ultrasonic switching frequencies.

10. The amplifier of claim 3 wherein said multiple has the value two.

11. The power amplifier of claim 3 wherein said resistance means comprises a field effect transistor connected to establish the current provided by said first current mirror by controlling the current flow between source and drain of said field effect transistor, the magnitude of the source to drain current being adjustably responsive to a potential applied to the gate of said field-effect transistor.

12. A hearing aid including a microphone, a power amplifier, and a miniature receiver transducer, a housing for said receiver transducer, said housing disposed within said hearing aid, said power amplifier being coupled to receive audio frequency input signals produced by said microphone and to drive said transducer in response to the input to said microphone, said housing having a septum wall therein defining first and second chambers, a transducer motor and said power amplifier being disposed within said first chamber, said second chamber being acoustically excitable, an acoustical output port for said second chamber, said transducer motor coupled to drivingly acoustically excite said second chamber and provide acoustical output through said port.

13. Apparatus as in claim 12 wherein said receiver housing is suitable for mounting in an in-the-ear hearing aid device.

14. A hearing aid as in claim 12 wherein said power amplifier comprises a CMOS chip operating as a Class D amplifier, a chip carrier, and said CMOS chip disposed on said chip carrier.

15. A hearing aid as in claim 14 wherein an inductor is also disposed in said first chamber, said inductor providing reduced power consumption by said amplifier.

16. A hearing aid as in claim 15 wherein said inductor includes a closed frame having a winding disposed on at least one leg thereof.

17. A hearing aid as in claim 15 wherein a filter element capacitor is also disposed in said first chamber in a position conjugate to said inductor.

* * * * *

UNITED STATES PATENT AND TRADEMARK OFFICE
CERTIFICATE OF CORRECTION

PATENT NO. : 4,592,087
DATED : May 27, 1986
INVENTOR(S) : Mead C. Killion

It is certified that error appears in the above-identified patent and that said Letters Patent are hereby corrected as shown below:

In column 14, line 59 replace "electronically" by -- electrically --.

Signed and Sealed this

Ninth Day of September 1986

[SEAL]

Attest:

DONALD J. QUIGG

Attesting Officer

Commissioner of Patents and Trademarks

REEXAMINATION CERTIFICATE (2967th)

United States Patent [19]
Killion

[11] B1 4,592,087
[45] Certificate Issued Aug. 13, 1996

[54] CLASS D HEARING AID AMPLIFIER

[75] Inventor: Mead C. Killion, Elk Grove Village, Ill.

[73] Assignee: Knowles Electronics, Inc., Itasca, Ill.

Reexamination Request:
No. 90/003,462, Jun. 2, 1994

Reexamination Certificate for:
| | |
|---|---|
| Patent No.: | 4,592,087 |
| Issued: | May 27, 1986 |
| Appl. No.: | 559,386 |
| Filed: | Dec. 8, 1983 |

[51] Int. Cl.$^6$ ............................................. H04R 25/00
[52] U.S. Cl. ............................ 381/68; 381/117; 330/251
[58] Field of Search ........................ 381/68, 68.4, 68.6; 330/251, 10; 331/57, 117

[56] References Cited

U.S. PATENT DOCUMENTS

| | | | |
|---|---|---|---|
| 2,984,792 | 5/1961 | Zadnicek | 330/10 |
| 3,182,384 | 5/1965 | Carlson et al. | 29/155.57 |
| 3,585,517 | 6/1971 | Herbert | 330/10 |
| 3,995,114 | 11/1976 | Marschinke | 179/1 A |
| 4,016,501 | 4/1977 | Jasinski et al. | 330/10 |
| 4,052,571 | 10/1977 | Gregory et al. | 179/107 R |
| 4,068,090 | 1/1978 | Komatsu et al. | 179/1 A |
| 4,072,910 | 2/1978 | Dingwall et al. | 331/57 |
| 4,085,382 | 4/1978 | Barber et al. | 330/262 |
| 4,109,116 | 8/1978 | Victoreen | 381/68 |
| 4,178,556 | 12/1979 | Attwood | 330/10 |
| 4,361,734 | 11/1982 | Kahn | 179/107 R |
| 4,396,806 | 8/1983 | Anderson | 179/107 FD |
| 4,404,526 | 9/1983 | Kirn | 330/10 |
| 4,471,490 | 9/1984 | Bellafiore | 381/69 |
| 4,490,585 | 12/1984 | Tanaka | 179/107 FD |
| 4,509,193 | 4/1985 | Carlson | 381/68 |

FOREIGN PATENT DOCUMENTS

| | | |
|---|---|---|
| 7907666 U | 3/1979 | Germany . |
| 8106942 U | 3/1981 | Germany . |
| 3151352 | 9/1982 | Germany . |
| 3205686A1 | 8/1983 | Germany . |
| 3205685A1 | 8/1983 | Germany . |
| 3306441A1 | 9/1983 | Germany . |
| 3309175A1 | 10/1983 | Germany . |
| 3231030A1 | 2/1984 | Germany . |
| 3345921A1 | 7/1984 | Germany . |
| 8517421 U | 6/1985 | Germany . |
| 3513197 | 11/1985 | Germany . |
| 3431584A1 | 3/1986 | Germany . |

OTHER PUBLICATIONS

Camenzind, "Modulated Pulse Audio Power Amplifier for Integrated Circuits" *IEEE Transactions on Audio and Electroacoustics* 1966, No. 3, pp. 136–140.

Translation and Original: S. P. Wouda, "Vier Watt Versterker Met Impulsbreedte–Modulatie" *Radio–Electronica*, pp. 547–550.

G. F. Turnbull and J. M. Townsend, "A Feedback Pulse Width Modulated Audio Amplifier", *Wireless World*, Apr. 1965, pp. 160–167.

Translation: Disclosure Publication re: DE 35 05 478 A1 for "Procedure and Circuit Arrangement for the Operation of Piezo–Ceramic Electro–Acoustic Transducer".

(List continued on next page.)

*Primary Examiner*—Sinh Tran

[57] ABSTRACT

A subminiature power amplifier for hearing aids configured to be completely self-contained and fit within the user's ear features a Class D amplifier stage. By configuring all signal elements as digital units, circuit balance is readily maintained. A substantial economy of battery drain is achieved while preserving a low value of distortion at low signal levels. Oscillator frequency is governed by a single resistance element. The amplifier and an optional efficiency-improving inductor can be accommodated entirely within the residual volume of the motor chamber of a state-of-the-art earphone housing.

Translation: Japanese Kokai Utility Model Patent, SHO 60-116800 (Asaide) for "Hearing Aid", dated Aug. 7, 1985; and Japanese original.

Catalog for Benefon PHOX Computer–Programmable Hearing Instruments.

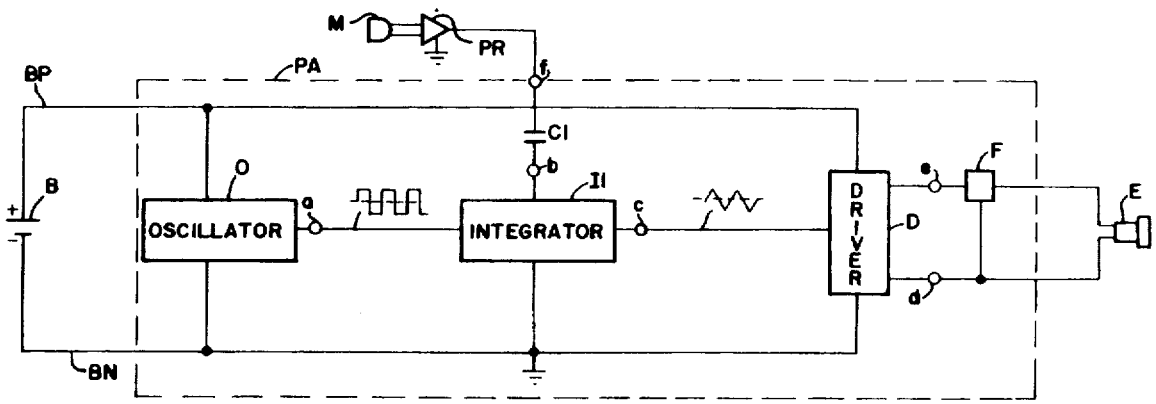

OTHER PUBLICATIONS

"Transactions on Industrial Electronics and Control Instrumentation", *IEEE* vol. IECI-26, No. 4, Nov. 1979, pp. 212-218.

"Information on PWM Current-Mode Power Amplifier", *IBM Technical Disclosure Bulletin*, vol. 28, No. 1, Jun. 1985, pp. 169-170.

Byron Nielsen, "Digital Hearing Aids: Where Are They?", *Hearing Instruments*, vol. 37, No. 2, 1986, p. 6, cont'd on p. 45.

(Author N/A), "PDM Verstaerker Audio Digital" *Elektor*, vol. 4, No. 12 (1978.12), pp. 12.36-12.39.

Translation: (Author N/A), "PDM Verstaerker Audio Digital" (PDM Audio Amplifiers), *Elektor*, vol. 4, No. 12 (1978.12), pp. 12.36-12.39.

(Author N/A), "Redactionele Emissies", *Radio Electronica*, No. 7, Jul. 1965, p. 533.

Ing. Günter Peltz, "PWM-Endverstaerker hoher Leistung für NF und Gleichstrom", *Elekronik*, 4/21.2. 1986, pp. 92-94.

T. G. Schwab, "Pulsdauermodulierte Verstaerker und ihre Anwendung im Niederfrequenzbereich", *Frequenz*, Mar. 22, 1968, pp. 69-81.

"D-Verstaerker" from *Radio Fernsehen Elektronik*, 24.(1975) H-23, pp. 753-754.

Gerd-Ulrich Vack, "Schaltungstechnik des D-Verstaerkers" *Radio Fernsehen Elektronik* 24.(1975), pp. 789-793.

(Author N/A) "Der PWM-Verstaerker", *Funkschau*, 2/77, Heft 2, pp. 85-86.

(Author N/A), "Schneller Transistor für PWM-Verstaerker", *Funkschau*, 1979, H-20, pp. 59-60 (1149-1150).

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–7, 9 and 11–12 are determined to be patentable as amended.

Claims 8, 10 and 13–17, dependent on an amended claim, are determined to be patentable.

New claims 18–28 are added and determined to be patentable.

1. In a *head worn* hearing aid *for a hearing impaired individual, said hearing aid* having a microphone, a power amplifier, [and] an output receiver transducer *for delivering sound only to the hearing impaired individual, and a nominal 1.2–1.5 volt battery*, said power amplifier being coupled to receive audio frequency input signals produced by said microphone and to drive said transducer in response to the *audio frequency* input *signals* to said microphone, the improvement wherein: said power amplifier is of the pulse-width modulation type *powered by said battery*, and in response to the absence of [an] *the audio frequency* input [signal] *signals* from said microphone said power amplifier couples to said transducer an alternating electrical pulse train of positive and negative electrical pulses of substantially zero average value at an ultrasonic frequency, said amplifier including means for controlling the time duration of said positive and negative electrical pulses responsively to the amplitude of the audio frequency [signal] *input signals* applied to the input of said power amplifier so as to provide to said transducer an audio frequency facsimile of said *audio frequency* input [signal] *signals, said amplifier including a MOSFET switching driver to drive said transducer*, wherein said hearing aid is provided with a hearing aid housing configured for [in-the-ear] *headworn* mounting and which contains said power amplifier.

2. Apparatus as in claim 1 further including [a battery and] filter means electrically interposed between said power amplifier and said transducer for allowing said audio frequency facsimile of said *audio frequency* input [signal] *signals* to be delivered to said transducer, said filter means presenting to the output of said amplifier a substantially inductive characteristic at said ultrasonic frequency and the principal harmonics thereof, to thereby reflect a substantial fraction of the power contained in ultrasonic frequencies back to said battery to minimize the current drain on said battery, said filter means including an inductor electronically interposed between said power amplifier and said transducer.

3. An integrated circuit class D hearing aid power amplifier *for a head worn hearing aid, said amplifier powered by a nominal 1.2–1.5 volt battery, said amplifier* for amplifying audio frequency input signals and for driving a receiver transducer connected thereto *for delivering amplified sound to a single hearing impaired individual*, said amplifier having complementary metal oxide semiconductor (CMOS) output devices driven in switching mode, said amplifier including an oscillator for providing signals controlling the switching of said output devices, said [switching] oscillator comprising cascaded CMOS switching stages configured as a ring oscillator, each stage including first and second current control elements governing stage output rise and fall time respectively, a first and a second current mirror, said first and second control elements being controllably responsiive to said first and second current mirrors respectively, said oscillator further comprising a resistance means connected to establish the current provided by said first current mirror, said second current mirror connected to said first current mirror to provide a replica of the current provided by said first current mirror, whereby said rise and fall times are substantially equal to provide symmetric operation at low current drain and so that the frequency of oscillation is controllably responsive to the value of said resistance means, said frequency of oscillation being chosen to be a multiple of the desired switching frequency, and means for dividing the oscillator output by said multiple to obtain symmetry of the oscillator output waveform.

4. The amplifier of claim 3 wherein said *switching stages of said* oscillator [stages] *further* comprise drive transistors connected to their respective current control elements at their respective sources so that said control elements provide a current limiting action by controlling source degeneration.

5. The amplifier of claim 3 wherein said *switching stages of said* oscillator [stages] comprise drive transistors connected at their respective drains to their respective current control elements so that said control elements provide a current limiting action.

6. Apparatus as in claim 3 wherein said oscillator produces an ultrasonic square wave, said amplifier including a biased integrator receiving said square wave and producing therefrom a triangular waveform output, said triangular waveform having voltage level axis crossings which are controlled by a bias applied to the integrator, said bias being produced responsively to said *audio frequency* input [signal] *signals*, said integrator shifting said axis crossings of the triangular waveform from a quiescent symmetric condition responsively to said *audio frequency* input signals, the amount of unbalance both in sign and magnitude being a continuously varying function of the amplitude of the *audio frequency* input waveform.

7. Apparatus as in claim 6 wherein said *complementary metal oxide semi-conductor* output devices of said amplifier are configured as a balanced [CMOS] switching driver having a pair of output terminals associated therewith, the axis crossings of the integrator output waveform being used to control the time duration and the polarity of the output of said driver, said driver producing positive and negative switching pulses which vary according to the time intervals between *the* axis crossings at the *output of the* integrator [output], thereby providing a pulse modulated signal having a frequency spectrum in the audio band representing a facsimile of the *integrator output* waveform supplied to the input of said amplifier.

9. Apparatus as in claim 8 further including a reactive filter coupled to the output of said switching driver so as to be interposed between said driver and said [receiver] transducer, said *reactive* filter having the property when coupled to a representative receiver transducer that as seen from the *switching* driver the resulting driver load appears substantially inductive at said ultrasonic switching frequencies.

11. The [power] amplifier of claim 3 wherein said resistance means comprises a field effect transistor connected to establish the current provided by said first current mirror by controlling the current flow between source and drain of said field effect transistor, the magnitude of the source to drain current being adjustably responsive to a potential applied to the gate of said field-effect transistor.

12. A hearing aid including a microphone, a power amplifier, and a miniature receiver transducer, a housing for said receiver transducer, said housing disposed within said hearing aid, said power amplifier being coupled to receive audio frequency input signals produced by said microphone and to drive said transducer in response to the *audio frequency input signals* to said microphone, said housing having a septum wall therein defining first and second chambers, a transducer motor and said power amplifier being disposed within said first chamber, said second chamber being acoustically excitable, an acoustical output port for said second chamber, said transducer motor coupled to drivingly acoustically excite said second chamber and provide acoustical output through said port.

18. The improvement of claim 1 wherein the microphone and receiver transducer are contained within the hearing aid housing.

19. The improvement of claim 18 wherein said housing includes a hearing output port and a tube extends from the receiver transducer to said hearing output port.

20. The improvement of claim 1 wherein the power amplifier has dimensions of approximately 0.30"×0.155"×0.095".

21. The improvement of claim 1 wherein the amplifier further includes an oscillator for providing signals controlling the switching of the output devices, the oscillator comprising cascaded switching stages configured as a ring oscillator, each stage including first and second current control elements governing stage output rise and fall times respectively, a first and a second current mirror, the first and second control elements being controllably responsive to the first and second current mirrors respectively, the oscillator further comprising a resistance means connected to establish the current provided by the first current mirror, the second current mirror connected to the first current mirror to provide a replica of the current provided by the first current mirror, whereby the rise and fall times are substantially equal to provide symmetric operation at low current drain and so that the frequency of oscillation is controllably responsive to the value of the resistance means, the frequency of oscillation being chosen to be a multiple of the desired switching frequency, and means for dividing the oscillator output by the multiple to obtain symmetry of the oscillator output waveform.

22. The improvement of claim 1 wherein said hearing aid housing is configured for in-the-ear headworn mounting.

23. The amplifier of claim 3 wherein the amplifier is contained within a hearing aid housing configured for in-the-ear mounting.

24. The amplifier of claim 23 wherein the microphone and receiver transducer are contained within the hearing aid housing.

25. The amplifier of claim 24 wherein said housing includes a hearing output port and a tube extends from the receiver transducer to said hearing output port.

26. The amplifier of claim 12 wherein the amplifier is contained within a hearing aid housing configured for in-the-ear mounting.

27. The amplifier of claim 26 wherein the microphone and receiver transducer are contained within the hearing aid housing.

28. The amplifier of claim 27 wherein said housing includes a hearing output port and a tube extends from the receiver transducer to said hearing output port.

* * * * *

EX PARTE REEXAMINATION CERTIFICATE (5487th)
United States Patent
Killion

(10) Number: US 4,592,087 C2
(45) Certificate Issued: Aug. 29, 2006

(54) CLASS D HEARING AID AMPLIFIER

(75) Inventor: Mead C. Killion, Elk Grove Village, IL (US)

(73) Assignee: Knowles Electronics, LLC, Itasca, IL (US)

Reexamination Request:
No. 90/007,059, Jun. 2, 2004

Reexamination Certificate for:
Patent No.: 4,592,087
Issued: May 27, 1986
Appl. No.: 06/559,386
Filed: Dec. 8, 1983

Reexamination Certificate B1 4,592,087 issued Aug. 13, 1996

Certificate of Correction issued Sep. 9, 1986.

(51) Int. Cl.
  *H04R 25/00* (2006.01)
  *H04R 3/00* (2006.01)

(52) U.S. Cl. ............ 381/312; 381/321; 381/322; 381/324; 381/328; 381/117; 330/251

(58) Field of Classification Search ........ 381/312, 381/316, 317, 320, 321, 322, 324, 328; 330/147, 330/251, 253
See application file for complete search history.

(56) References Cited

U.S. PATENT DOCUMENTS

| | | | |
|---|---|---|---|
| 3,784,923 A | 1/1974 | Rezek | 330/22 |
| 3,999,143 A | 12/1976 | Yoshida et al. | 330/207 A |
| 4,016,501 A | 4/1977 | Jasinski et al. | 330/10 |
| 4,068,090 A | 1/1978 | Komatsu et al. | 179/1 A |
| 4,072,910 A | 2/1978 | Dingwall et al. | 331/57 |
| 4,178,556 A | 12/1979 | Attwood | 330/10 |
| 4,181,895 A | 1/1980 | Yoshida | 330/279 |
| 4,275,359 A | 6/1981 | Yoshida et al. | 330/251 |
| 4,310,831 A | 1/1982 | Henderson et al. | 704/258 |
| 4,313,065 A | 1/1982 | Yoshida et al. | 327/437 |
| 4,322,788 A | 3/1982 | Yoshida et al. | 363/49 |
| 4,347,481 A | 8/1982 | Yoshida et al. | 330/251 |
| 4,357,497 A | 11/1982 | Hochmair et al. | 607/5 |
| 4,397,562 A | 8/1983 | Shirasu | 368/63 |
| 4,419,995 A | 12/1983 | Hochmair et al. | 607/57 |
| 4,462,030 A | 7/1984 | Ishii | 340/825.44 |
| 4,463,318 A | 7/1984 | Kaplan | 330/251 |
| 4,471,171 A | 9/1984 | Kopke et al. | 381/60 |
| 4,471,490 A | 9/1984 | Bellafiore | 381/69 |
| 4,532,930 A | 8/1985 | Crosby et al. | 607/57 |
| 4,539,440 A | 9/1985 | Sciarra | 381/329 |
| 4,545,065 A | 10/1985 | Visser | 381/41 |
| 4,577,641 A | 3/1986 | Hochmair | 128/746 |
| 4,737,731 A | 4/1988 | Swanson et al. | 330/149 |

OTHER PUBLICATIONS

Camenzind, "Modulated Pulse Audio Power Amplifier for Integrated Circuits" *IEEE Transactions on Audio and Electroacoustics* 1966, No. 3, pp. 136–140.
Translation and Original: S. P. Wounda, "Vier Watt Versterker Met Impulsbreedte–Modulatie" *Radio–Electronica*, pp. 547–550.
(Author N/A), "PDM Verstaerker Audio Digital" *Elektor*, vol. 4, No. 12 (1978.12), pp. 12.36–12.39.
Translation: (Author N/A), "PDM Verstaerker Audio Digital" (PDM Audio Amplifiers), *Elektor*, vol. 4, No. 12 (1978.12), pp. 12.36–12.39.
T. G. Schwab; "Pulsdauermodulierte Verstaerker und ihre Anwendung im Niederfrequenzbereich", *Frequenc*, Mar. 22, 1968, pp. 69–81.
"D–Verstaerker" from *Radio Fernsehen Elektronik*, 24.(1975) H–23, pp. 753–754.
Gerd–Ulrich Vack, "Schaltungstechnik des D–Verstaerkers" *Radio Fernsehen Elektronik* 24.(1975), pp. 789–793.

*Primary Examiner*—Suhan Ni

(57) ABSTRACT

A subminiature power amplifier for hearing aids configured to be completely self-contained and fit within the user's ear features a Class D amplifier stage. By configuring all signal elements as digital units, circuit balance is readily maintained. A substantial economy of battery drain is achieved while preserving a low value of distortion at low signal levels. Oscillator frequency is governed by a single resistance element. The amplifier and an optional efficiency-improving inductor can be accommodated entirely within the residual volume of the motor chamber of a state-of-the-art earphone housing.

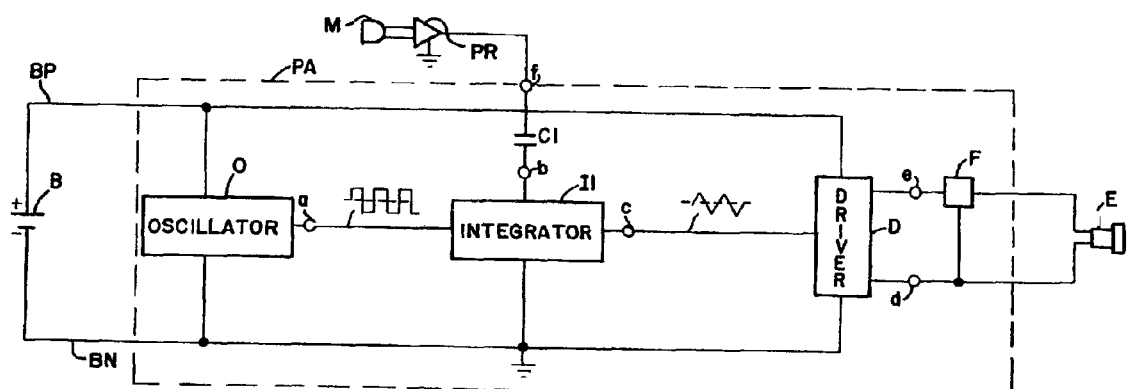

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–28 is confirmed.

* * * * *